United States Patent [19]

Irving et al.

[11] Patent Number: 4,548,895
[45] Date of Patent: Oct. 22, 1985

[54] PROCESS FOR THE PRODUCTION OF IMAGES USING A HEATING STEP PRIOR TO IMAGING

[75] Inventors: Edward Irving, Burwell; Terence J. Smith, Royston, both of England

[73] Assignee: Ciba Geigy Corporation, Ardsley, N.Y.

[21] Appl. No.: 586,897

[22] Filed: Mar. 7, 1984

[30] Foreign Application Priority Data

Mar. 16, 1983 [GB] United Kingdom ............... 8307220

[51] Int. Cl.$^4$ .............................................. G03C 5/00
[52] U.S. Cl. .................... 430/325; 430/280; 430/330; 204/159.11; 204/159.23
[58] Field of Search .............. 430/280, 281, 277, 325, 430/330; 204/159.11, 159.23

[56] References Cited

U.S. PATENT DOCUMENTS

| | | |
|---|---|---|
| 3,424,699 | 12/1969 | Stark et al. |
| 3,450,613 | 6/1969 | Fleming et al. |
| 3,770,443 | 11/1973 | Osada et al. ......................... 430/280 |
| 3,784,647 | 1/1974 | Fleming et al. |
| 3,796,578 | 3/1974 | Hosoi et al. ......................... 430/280 |
| 3,989,610 | 11/1976 | Tsukada et al. ..................... 430/280 |
| 4,025,348 | 5/1977 | Tsukada et al. ..................... 430/280 |
| 4,047,963 | 9/1977 | Simpson ............................. 430/280 |
| 4,054,451 | 10/1977 | Schlesinger et al. ............... 430/280 |
| 4,074,008 | 2/1978 | Green ................................. 430/280 |
| 4,090,936 | 5/1978 | Barton ............................... 430/280 |
| 4,171,974 | 10/1979 | Golda et al. ....................... 430/280 |
| 4,192,924 | 3/1980 | Crivello. |
| 4,237,216 | 12/1980 | Skarvinao .......................... 430/280 |
| 4,278,754 | 7/1981 | Yamashita et al. ................. 430/280 |
| 4,288,527 | 9/1981 | Morgan. |
| 4,291,118 | 9/1981 | Boduch et al. |
| 4,317,858 | 4/1982 | Sattler ............................... 428/379 |
| 4,352,723 | 10/1982 | Morgan. |
| 4,358,477 | 9/1982 | Nooman et al. .................... 427/54.1 |
| 4,374,751 | 2/1983 | Morgan. |

OTHER PUBLICATIONS

Beringer and Bodlaender, J. Org. Chem., 1968, 33 2981-2984.

Primary Examiner—Jack P. Brammer
Attorney, Agent, or Firm—Harry Falber

[57] ABSTRACT

A layer of a liquid composition containing (A) a heat-activated polymerizing agent for 1,2-epoxides, (B) a light-sensitive compound having in the same molecule at least one 1,2-epoxide group of formula

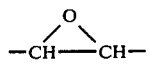

I and at least one unsaturated ester group of formula

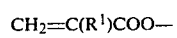

II where $R^1$=H, Cl, Br, or $C_1$-$C_4$ alkyl, a mixture of (C) a compound containing at least one 1,2-epoxide group of formula I together with (D) a compound containing at least one unsaturated ester group of formula II, or a mixture of (B) with (C) and/or (D), is heated to solidify the layer, and subsequently it is exposed to actinic radiation in a predetermined pattern and those parts of the layer that have not become photopolymerized are removed by treatment with a suitable solvent.

An example of a suitable polymerizing agent (A) is the complex of boron trifluoride with monoethylamine. An example of a light-sensitive compound (B) is glycidyl methacrylate. The epoxide compound (C) may be the diglycidyl ether of 2,2-bis(4-hydroxyphenyl)propane, and the unsaturated ester (D) may be 1,4-bis(2-hydroxy-3-acryloyloxypropoxy)butane.

18 Claims, No Drawings

PROCESS FOR THE PRODUCTION OF IMAGES USING A HEATING STEP PRIOR TO IMAGING

This invention relates to a process for the production of images by heating followed by exposure to actinic radiation.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through a negative whereby the parts of the film struck by the irradiation become photopolymerised (and less soluble) while those parts shielded from the irradiation remain substantially unaffected, then dissolving away the unirradiated, unphotopolymerised parts of the film by means of a suitable solvent which does not dissolve the irradiated, photopolymerised parts. This last stage is conventionally known as "development".

It would be desirable to have a process in which a layer of a photopolymerisable substance is applied to a support and this layer is converted into a substantially solid, non-tacky state, ready for irradiation, without the use of organic solvents. Not only would, in this stage, the use be avoided of solvents which might present problems of toxicity and flammability and also cause expense in their recovery, but the production on a continuous basis of coated supports, ready for irradiation, would be facilitated.

We have found that this object can be achieved by the use of certain liquid compositions which contain two types of groups through which, respectively, thermal polymerisation and photopolymerisation can occur. These two types of groups may form part of the same molecule or they may form part of different molecules. The groups are chosen so that thermal polymerisation of a layer of the liquid composition occurs rapidly to form a solid, essentially tack-free layer, which is, however, still soluble in certain solvents. When desired, a part or parts of the layer are subjected to actinic radiation and photopolymerisation takes place through the other type of group in the already thermally polymerised layer, the parts of the layer which undergo photopolymerisation becoming much more resistant to solution in the solvent.

U.S. Pat. No. 4,291,118 relates to a method for forming relief images from a film of a liquid photopolymerisable material, comprising exposing the film to chemical hardening treatment sufficient to solidify it, then treating the solidified film in a pattern in a manner differentiating the chemical condition of the film in the pattern as distinct from the chemical condition of the solidified mass not in the pattern, and then selectively removing the portion of the mass in one of the chemical conditions leaving that portion of the mass in the other chemical condition to form a relief image. To bring about the differentiation in chemical condition actinic radiation is used in all the embodiments described, although the disclosure contains the remark "Heat could also by extension be used".

In the process described in the U.S. patent, therefore, the film of liquid material is exposed to actinic radiation and then the solidified film is re-exposed to actinic radiation in the form of a pattern so that a part or parts of it become less easily removed by a solvent, and finally the image is developed by washing away with the solvent the more readily removed part or parts, i.e., those which were not re-exposed.

The conditions of exposure have to be carefully controlled; if the first exposure is insufficient, the solidified material remains tacky and inconvenient to handle whereas if it is excessive, images of poor definition are obtained.

Only the use of photopolymerisable polyene-polythiol compositions is described. These have the disadvantage that the polymerisation which is initiated on exposure to actinic radiation continues when such exposure is interrupted. It follows that if images of good quality are to be obtained the second irradiation stage must be performed without delay. This is a constraint on industrial utilisation of the process.

U.S. Pat. Nos. 4,288,527 and 4,352,723 describe acrylate compositions that are cured by both ultraviolet radiation and heat, in either order or simultaneously to form solid products suitable for use as coatings, gaskets, sealants, resists and the like. The compositions may contain a catalytic amount of a pinacol, a photoinitiator and, optionally, a copolymerisable monomer or reactive diluent. These patents do not disclose a process in which a liquid composition is first solidified by heat polymerisation and then an image is formed by selective UV irradiation.

These patents further do not disclose a process in which there may be a delay between the heating stage and the UV irradiation stage with no loss of image quality.

It has now been found that the disadvantages of the prior art processes can be overcome by the use of compositions containing both 1,2-epoxide groups and acrylate groups, on the same or different molecules.

Compounds containing one or more epoxide groups, and those containing one or more acrylate groups are very well known and are commercially available. Compounds containing in the same molecule both at least one 1,2-epoxide group and at least one acrylate group are also known and some are commercially available, such as glycidyl methacrylate. Others are described in, for example, U.S. Pat. No. 3,450,613, which describes such dual-functional materials and their preparation from an epoxy resin prepolymer containing at least two epoxide groups and an α,β-ethylenically unsaturated carboxylic acid, especially acrylic or methacrylic acid. This specification describes the cure of such dual-functional materials by irradiation followed by heating, and their use as optical cements.

We have surprisingly found that polymerisation of liquid compositions containing an epoxy group and an acrylate group can be carried out using selected polymerising agents on a carrier such as a copper-clad laminate, without the need to use a volatile solvent, to form a solid but still curable layer on the carrier. This layer can then be exposed imagewise to actinic radiation to cure the exposed areas, leaving the unexposed areas soluble in a developer.

One aspect of this invention accordingly provides a process for the production of an image which comprises (i) heating a layer, supported on a carrier, of a liquid composition containing (A) a heat-activated latent polymerising agent for 1,2-epoxides with (B) a light-sensitive compound having in the same molecule at least one 1,2-epoxide group of formula

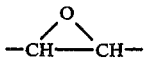

and at least one unsaturated ester group of formula $$CH_2=C(R^1)COO-  \quad\quad II$$

where $R^1$ is a hydrogen, chlorine, or bromine atom or an alkyl group of 1 to 4 carbon atoms, especially a hydrogen atom or a methyl group, or with a mixture of (C) a compound containing at least one 1,2-epoxide group of formula I, together with (D) a compound containing at least one unsaturated ester group of formula II, or with a mixture of a compound (B) with a compound (C) and/or D, such that the layer solidifies and becomes essentially non-tacky but remains photopolymerisable and subsequently (ii) exposing the solidified layer to actinic radiation in a predetermined pattern such that exposed parts of the layer are photopolymerised and (iii) removing those parts of the layer which have not become substantially photopolymerised by treatment with a solvent therefor.

The phrase "exposing in a predetermined pattern" includes both exposure through an image-bearing transparency and exposure to a laser beam moved as directed by a computer to form an image.

Usually the compound (C) contains one or two groups of formula I, and the compound (D) contains two or more groups of formula II. Generally (B), (C), and (D) have a molecular weight of at most 3000. Preferably the group or groups of formula I are either directly attached to a cycloaliphatic ring through both indicated free valencies, or form part of a 2,3-epoxypropyl group directly attached to an atom of oxygen, nitrogen, or sulphur.

Preferred compounds (B) are those which contain 1 or 2 groups of formula I and 1 to 6 groups of formula II. These groups may be attached to aliphatic, aromatic, araliphatic, cycloaliphatic or heterocyclic molecules. Typical compounds (B) are those of the formula

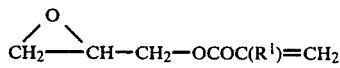

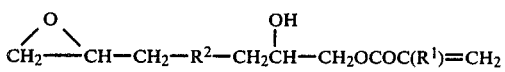

and

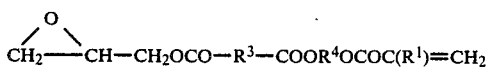

where $R^1$ is as hereinbefore defined, $R^2$ represents the residue of a di or polyglycidyl compound after the removal of two glycidyl groups, $R^3$ represents the residue of a di or polycarboxylic acid after the removal of two carboxylic acid groups, and $R^4$ represents an alkylene chain of from 1 to 6 carbon atoms.

Suitable such residues $R^2$ include dihydric phenol, especially bisphenol, residues after removal of the two phenolic hydrogen atoms, glycol residues after removal of the two alcoholic hydrogen atoms, and hydantoin residues after removal of the two amidic hydrogen atoms. Suitable residues $R^3$ are saturated or unsaturated aliphatic or aromatic dicarboxylic acid residues and aromatic tri- or tetracarboxylic acid residues, after removal of two carboxylic acid groups, such as succinic, malonic, maleic, phthalic, trimellitic and pyromellitic acid residues. Suitable alkylene groups $R^4$ are ethylene, propylene, and butylene groups.

Suitable compounds (B) may be made by introducing a group of formula II into a compound which already contains one or more 1,2-epoxide groups or, conversely, by introducing one or more 1,2-epoxide groups into a compound that already contains one or more groups of formula II.

A convenient method of introducing groups of formula II into a compound that already contains epoxide groups to produce, for example, a compound of formula IV comprises reaction of an at least diepoxide with a stoichiometric deficit, based on the epoxide group content, of a compound containing both a group of formula II and also a group, such as a carboxylic acid, phenolic or alcoholic hydroxyl, or imido group, capable of reaction with a 1,2-epoxide group so as to introduce at least one group of formula II into the molecule. Suitable polyepoxides include those mentioned below as suitable for use as compound (C).

It will be understood that this method will not usually give rise to a 100% yield of material containing, on the same molecule, both a 1,2-epoxide group of formula I and an acrylate group of formula II. The other material in the product comprises a mixture of unchanged starting material containing the original number of epoxide groups, and material in which all epoxide groups have been replaced by groups of formula II. However, since such mixtures may be successfully used in the present process, the fact that the reaction product is a mixture is of no consequence.

Another method of making compounds (B), for example, those of formula III, by introducing an epoxide group or groups into a compound having at least one group of formula II, comprises using as the latter a compound which has also at least one alcoholic hydroxyl, or a carboxyl, group, and treating it such that the group or groups is or are converted into 1,2-epoxide groups, using methods known in the art of epoxide resins for converting hydroxyl or carboxyl groups into glycidyl ether for ester groups. For example, the compound is caused to react with epichlorohydrin in the presence of a hydrogen chloride acceptor (usually a strong base, e.g., NaOH) and preferably of a catalyst such as a quaternary ammonium compound, a tertiary amine, a transition metal salt, a thioether, or a sulphonium salt. Usually an excess of epichlorohydrin over the theoretical quantity required is employed, the excess serving as solvent for the reaction, which is normally carried out at a temperature of 30° to 120° C., preferably 40° to 65° C., and usually under reduced pressure in order to remove the water formed during the reaction.

A convenient method of making compounds (B) such as those of formula V comprises converting a hydroxy-substituted compound containing a group of formula II into a half-ester by reaction with a polycarboxylic acid anhydride. The free carboxylic acid group(s) may then be glycidylated, following the method outlined above, or may be esterified by treatment with a compound containing two or more epoxide groups, usually at 60° to 120° C. in the presence of a strong base and a catalyst such as a quaternary ammonium compound, or a transition metal salt.

Typical compounds (B) are glycidyl acrylate, glycidyl methacrylate, 2-(4-glycidyloxyphenyl)-2-(4-(3-acryloyloxy-2-hydroxypropoxy)phenyl)propane, 2-(4-(glycidyloxyphenyl)-2-(4-(2-hydroxy-3-methacryloyloxy)propoxy)phenyl)propane, 1-(2-methacryloyloxyethoxycarbonyl)-2,4- and 2,5-bis(glycidyloxycarbonyl)benzene, 1-(2-acryloyloxyethoxycarbonyl)-2,4- and 2,5-bis(glycidyloxycarbonyl)benzene, 2-acryloyloxyethoxy glycidyl succinate, 2-methacryloyloxyethoxy glycidyl succinate, 1-glycidyl-3-(3-acryloyloxy-2-hydroxypropyl)-5,5-dimethylhydantoin, 1-glycidyl-3-(2-hydroxy-3-methacryloyloxypropyl)-5,5-dimethylhydantoin, 1-glycidyloxy-4-(3-acryloyloxy-2-hydroxypropyloxy)butane, 1-glycidyloxy-4-(2-hydroxy-3-methacryloyloxypropyloxy)butane, and the reaction product of 3,4-epoxycyclohexylmethyl-3',4'-epoxycyclohexanecarboxylate with 1 equivalent of acrylic or methacrylic acid.

Typical compounds (C) are mono or polyglycidyl esters obtainable by reaction of a compound containing one or more carboxylic acid groups per molecule with epichlorohydrin or glycerol dichlorohydrin in the presence of an alkali. Such glycidyl esters are preferably derived from aliphatic mono and polycarboxylic acids, e.g., acetic and propionic acid, succinic acid, glutaric acid, adipic acid, pimelic acid, suberic acid, azelaic acid, sebacic acid, or dimerised or trimerised linoleic acid; from cycloaliphatic mono and polycarboxylic acids such as tetrahydrophthalic acid, cyclohexane carboxylic acid, 4-methyltetrahydrophthalic acid, hexahydrophthalic acid, and 4-methylhexahydrophthalic acid; and from aromatic mono and polycarboxylic acids such as benzoic acid, phthalic acid, isophthalic acid, and terephthalic acid.

Further examples are mono and polyglycidyl ethers obtainable by reaction of a compound containing one or more free alcoholic hydroxyl and/or phenolic hydroxyl groups per molecule with epichlorohydrin under alkaline conditions or, alternatively, in the presence of an acidic catalyst and subsequent treatment with alkali. These ethers may be made from acyclic alcohols such as butanol and other monohydric alcohols having from 1 to 8 carbon atoms, ethylene glycol, poly(oxyethylene)-glycols, propane-1,2-diol, poly(oxypropylene) glycols, propane-1,3-diol, butane-1,4-diol, poly(oxytetramethylene) glycols, glycerol, pentaerythritol, and poly(epichlorohydrin). Or they may be made from mononuclear phenols, such as phenol itself, cresol, resorcinol and from polynuclear phenols, such as bis(4-hydroxyphenyl)methane, 4,4'-dihydroxydiphenyl, bis(4-hydroxyphenyl)sulphone, 1,1,2,2-tetrakis(4-hydroxyphenyl)ethane, 2,2-bis(4-hydroxyphenyl)propane (otherwise known as bisphenol A), 2,2-bis(3,5-dibromo-4-hydroxyphenyl)propane, and novolaks formed from aldehydes such as formaldehyde with phenol.

Other suitable compounds (C) are poly(N-glycidyl) compounds including, for example, those obtained by dehydrochlorination of the reaction products of epichlorohydrin with amines containing at least two amino-hydrogen atoms, such as aniline, n-butylamine, and bis(4-aminophenyl)methane; triglycidyl isocyanurate; and N,N'-diglycidyl derivatives of cyclic alkylene ureas, such as ethyleneurea, and of hydantoins such as 5,5-dimethylhydantoin.

Epoxide resins in which some or all of the epoxide groups are not terminal may also be employed, such as vinylcyclohexene dioxide, limonene dioxide, dicyclopentadiene dioxide, 4-oxatetracyclo[6.2.1.0$^{2,7}$.0$^{3,5}$]undec-9-yl glycidyl ether, the bis(4-oxatetracyclo[6.2.1.0$^{2,7}$.0$^{3,5}$]undec-9-yl) ether of ethylene glycol, 3,4-epoxycyclohexylmethyl 3',4'-epoxycyclohexanecarboxylate and its 6,6'-dimethyl derivative, the bis(3,4-epoxycyclohexanecarboxylate) of ethylene glycol, 3-(3,4-epoxycyclohexyl)-8,9-epoxy-2,4-dioxaspiro[5,5]undecane, and epoxidised butadienes or copolymers of butadiene with ethylenic compounds such as styrene and vinyl acetate. If desired a mixture of compounds (C) may be used.

Especially preferred compounds (C), used in the process of this invention are 2,2,4-trimethylpentyl glycidyl ether (isooctyl glycidyl ether), phenyl glycidyl ether, butyl glycidyl ether, diglycidyl ethers of dihydric phenols such as 2,2-bis(4-hydroxyphenyl)propane and bis(4-hydroxyphenyl)methane and of dihydric alcohols such as of butane-1,4-diol, N,N'-derivatives of hydantoins, such as 1,3-diglycidyl-5,5-dimethylhydantoin, and cycloaliphatic epoxide resins such as 3,4-epoxycyclohexylmethyl-3',4'-epoxycyclohexanecarboxylate.

Suitable compounds (D) include acrylates and methacrylates of monohydric alcohols such as 2-methoxyethanol, tetrahydrofurfuryl alcohol and cyclohexanol, and full and partial esters of acrylic and methacrylic acid with aliphatic glycols such as diethylene and dipropylene glycols, triethylene and tripropylene glycols, tetraethylene glycol, and higher polyoxyalkylene glycols, and higher functional polyols such as trimethylolpropane and pentaerythritol. Also suitable as compound (D) are 2-hydroxypropyl esters, formed by reaction of a compound containing one or more glycidyl groups, especially a mono- or polyglycidyl ether of a mono- or polyhydric alcohol or phenol or a N-glycidylhydantoin, with acrylic or methacrylic acid. Other suitable compounds (D) are esters formed by reaction of a diepoxide or other polyepoxide with an equivalent amount of an adduct of a hydroxyalkyl acrylate or methacrylate with a saturated or unsaturated dicarboxylic acid anhydride such as succinic, maleic, or phthalic anhydride. Typical such compounds (D) include 1,4-bis(2-hydroxy-3-acryloyloxypropoxy)butane, a poly(2-hydroxy-3-acryloyloxypropyl)ether of a bisphenol or a phenol-formaldehyde novolak, 2,2-bis(4-(2-hydroxy-3-(2-acryloyloxyethoxy)succinyloxypropoxy)phenyl)propane, 1-(2-hydroxy-3-acryloyloxypropoxy)-butane, -octane, and -decane, bis(2-hydroxy-3-acryloyloxypropyl)adipate, 2-hydroxy-3-acryloyloxypropyl propionate, and 3-phenoxy-2-hydroxypropyl acrylate, and the corresponding methacrylates.

The polymerising agent (A) is one having little or no effect on an epoxide group of (B) or (C) below a certain 'threshold temperature' but which causes rapid polymerisation through the epoxide ring once the temperature of the mixture rises above that threshold temperature. The threshold temperature is preferably at least 80° C. so that (A) has a significant heat-polymerising effect on (B) or (C) only at temperatures above 80° C. Generally the layer is heated at 100° to 200° C. for 2 to 60 minutes, preferably 2 to 40 minutes, particularly 2 to 20 minutes.

Suitable polymerising agents (A) include complexes of boron trichloride or of boron trifluoride, chelates of boron difluoride, dicyandiamide, imidazoles, and mixtures of an aromatic onium salt or aromatic iodosyl salt of a metal halogenide acid or a metalloid halogenide acid together with a catalyst which is a salt or complex of a d-block transition metal, a stannous salt, an organic peroxide, or an activated α-hydroxy compound, that is a compound having a hydroxy group attached to a carbon atom which is alpha to an activating group such as a carbonyl group or a carbon atom having a hydroxy group attached thereto, the compound forming free radicals on heating.

Suitable boron difluoride chelates such as difluoroboronacetoacetanilide are described in U.S. Pat. No. 3,424,699. Suitable imidazoles include 2-methylimidazole, 2-phenylimidazole, 1-benzyl-2-methylimidazole and 1-cyanoethyl-2-methylimidazole. Suitable mixtures of aromatic onium salts, such as iodonium or sulphonium salts, with catalysts are described in U.S. Pat. Nos. 4,192,924 and 4,374,751.

Preferred polymerising agents (A) are complexes of boron trichloride with a tertiary amine, or of boron trifluoride with a triaryl phosphine, with piperidine, or with a primary amine, these primary and tertiary amines being aliphatic, cycloaliphatic or heterocyclic. An example of a suitable boron trichloridetertiary amine complex is boron trichloride-trimethylamine complex; other suitable boron trichloride-tertiary amine complexes are described in U.S. Pat. No. 3,784,647, an especially preferred such complex being boron trichlorideoctyldimethylamine complex. Examples of suitable boron trifluoride complexes are those with triphenylphosphine, isophoronediamine, benzylamine, cyclohexylamine and tetramethylhexamethylenediamine. An especially preferred boron trifluoride complex is that with ethylamine.

Other preferred polymerising agents (A) are mixtures of (a) a salt having a diphenyliodosyl cation, in which the phenyl groups may be substituted by an alkyl group of 1 to 4 carbon atoms, a nitro group or a halogen atom, and an anion which is $Sb(OH)F_5^-$, $AsF_6^-$, $SbCl_6^-$, $BiCl_6^-$, $SbF_6^-$, $SnCl_5^-$, $FeCl_4^-$, $BF_4^-$ or $PF_6^-$, the last two being especially preferred, and (b) as catalyst for the iodosyl salt, benzoyl peroxide, stannous chloride, ascorbic acid, pinacol, benzpincacol, a salt of zinc, cobalt, chromium, iron or, especially, copper, such as a chloride, acetate or trichloroacetate, a complex of such a metal with a 1,3-diketone such as acetylacetone, benzoylacetone or ethyl acetoacetate, or a mixture of such catalysts. The amount of catalyst (b) is generally from 10% to 150% by weight of the diphenyliodosyl salt.

The diphenyliodosyl salts may be prepared by methods similar to, or analogous to, those described by F. M. Beringer and P. Bodlaender, J. Org. Chem. 1968, 33, 2981-4.

The amount of polymerising agent (A) used is generally from 1 to 10 parts by weight per 100 parts in total of compound (B) and/or (C); 2 to 5 parts by weight of (A) per 100 parts by weight of (B) and/or (C) is particularly preferred.

The compounds (B), (C) and (D) may be liquids or solids, but as stated above, the compositions are applied in a liquid form to a carrier. The viscosity of the composition preferably lies within the range 0.1 to 15 Pa s. To render solid materials into the liquid form, and to meet this desired range of viscosity without the addition of volatile solvents, it may be necessary to use mixtures of compounds (B) and (D), or (B) and (C) or (B), (C), and (D). It is particularly advantageous to include, as an epoxide-functional material (C), a monoepoxide, either alone or in admixture with other epoxide-functional materials (B) and (C). Particularly preferred monoepoxides include n-butyl glycidyl ether, phenyl glycidyl ether and iso-octyl glycidyl ether.

In addition, other photopolymerisable monomers may be included within the compositions used in accordance with the present invention to modify the properties of the uncured and cured compositions. Typical amongst such photopolymerisable monomers are acrylic and methacrylic acid.

Compounds having 2 or more alcoholic hydroxyl groups, which may be primary and/or secondary, may be added to the compositions to assist the thermal polymerisation of the epoxide residue. Suitable polyhydroxy compounds are diols such as 1,4-butanediol and triols such as glycerol. Preferred polyhydroxy compounds have molecular weights of at least 100 and particularly more than 500. Examples of suitable compounds having such molecular weights are polyoxyalkylene glycols and triols, such as polyoxyethylene, polyoxypropylene and polyoxytetramethylene glycols and triols, polyepichlorohydrins, hydroxyl-terminated polycaprolactones, polymers of hydroxyalkyl acrylates and methacrylates, copolymers of allyl alcohol with a vinyl monomer such as styrene, polyvinyl alcohols, hydroxypropylcellulose, and hydroxyl-containing polyvinyl acetals.

Preferably the photopolymerisable composition is irradiated in the presence of a photopolymerisation catalyst. Suitable catalysts are those which, on irradiation, give an excited state that leads to formation of free radicals which then initiate polymerisation of the monomer (photoinitiators).

Suitable photoinitiators include α-halogen substituted acetophenones such as 2,2,2-trichloro-4'-tert.butylacetophenone, benzophenones, O-alkoxycarbonyl derivatives of an oxime of benzil or 1-phenylpropane-1, 2-dione, such as benzil (O-ethoxycarbonyl)-α-monoxime and 1-phenylpropane-1, 2-dione-2-(O-ethoxycarbonyl)oxime, benzil ketals, e.g., benzildimethyl ketal, and mixtures of phenothiazine dyes (e.g., methylene blue) or quinoxalines (e.g., metal salts of 2-(m- or p-methoxyphenyl)quinoxaline-6'- or 7'-sulphonic acids) with electron donors such as sodium benzenesulphinate or other sulphinic acid or a salt thereof, an arsine, a phosphine, or thiourea (photoredox systems). Benzildimethyl ketal is an especially preferred photoinitiator.

Generally, 0.1 to 20%, and preferably 0.5 to 15% by weight of photopolymerisation catalyst is incorporated, based on the combined weight of (B) and/or (C) and (D).

The liquid composition can be applied to suitable carriers by the customary techniques, such as spray coating, whirler coating, roller coating, cascade coating, and especially curtain coating. Typically, the carrier is coated such that the layer of the composition is 1 to 250 μm thick. The carrier may be of, for example, copper, aluminium or other metal, paper, synthetic resin, or glass.

In the photopolymerisation stage of the process of this invention actinic radiation of wavelength 200–600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The times required for the exposure will depend upon a variety of factors which include, for example, the individual compounds used, the type of light source, and the distance of that source from the irradiated composition. Suitable times may be readily determined by those familiar with photopolymerisation techniques.

Suitable developers of the image are readily found by routine testing and include cyclohexanone, trimethylcyclohexanone, 2-ethoxyethanol, 1,1,1-trichloroethane, toluene, acetone, and mixtures thereof and also water or dilute aqueous acid or alkali. The action of the developer may need to be assisted by agitation or by gentle brushing. When the carrier has a layer of a suitable electrically-conducting metal, usually copper or silver, immediately in contact with the composition, after exposure the unphotopolymerised material can be removed to expose the metal. Metal so exposed may then be etched away in he non-image areas, so forming a printed circuit, by means of etching fluids such as ferric chloride or ammonium persulphate solutions.

This invention will now be illustrated by reference to the following Examples in which all parts and percentages are by weight.

The compounds used in these Examples are prepared as follows:

Resin I 2,2-Bis(4-glycidyloxyphenyl)propane, having an epoxide content of 5.1 equivalents/kg (100 g) and 2,6-di-tert.butyl-4-methylphenol (0.1 g) are stirred together and heated to 100° C. To this mixture ther is slowly added, over 1½ hours, a mixture of methacrylic acid (22.8 g), chromium (III) tris octanoate (0.05 g), and 2,6-di-tert.butyl-4-methylphenol (0.2 g). On complete addition the mixture is stirred at 100° C. for a further ¾ hour and cooled. The product, consisting of a mixture of 2-(4-glycidyloxyphenyl)-2-(4-(2-hydroxy-3-methacryloyloxypropoxy)phenyl)propane, 2,2-bis(4-glycidyloxyphenyl)propane, and 2,2-bis(4-(2-hydroxy-3-methacryloyloxypropoxy)phenyl)propane, has an epoxide content of 2.23 equivalents/kg.

Resin II

This designation denotes a commercially-available sample of glycidyl methacrylate, having an epoxide content of 7.0 equivalents/kg.

Resin III 1,4-Diglycidyloxybutane, having an epoxide content of 9.35 equivalents/kg (500 g), is mixed with 2,6-di-tert.butyl-4-methylphenol (0.5 g) and chromium (III) tris octanoate (0.25 g), and the mixture stirred at 100° C. during the addition, over 1½ hours, of methacrylic acid (201.0 g) and 2,6-di-tert.butyl-4-methylphenol (1.0 g). After the mixture has been stirred at 100° C. for a further 2¾ hours the product, consisting of a mixture of 1-glycidyloxy-4-(2-hydroxy-3-methacryloyloxypropyloxy)butane, 1,4-diglycidyloxybutane, and 1,4-bis(2-hydroxy-3-methacryloyloxypropyloxy)butane, has an epoxide content of 3.45 equivalents/kg.

Resin IV 1,3-Diglycidyl-5,5-dimethylhydantoin (400 g), having an epoxide content of 8.1 equivalents/kg, is mixed with 2,6-di-tert.butyl-4-methylphenol (0.4 g) and chromium (III) tris octanoate (0.2 g), and the mixture stirred at 100° C. during the addition, over 1½ hours, of methacrylic acid (139.3 g) and 2,6-di-tert.butyl-4-methylphenol (0.8 g). After the mixture has been stirred at 100° C. for a further 2¾ hours the product, consisting of a mixture of 1-glycidyl-3-(2-hydroxy-3-methacryloyloxypropyl)-5,5-dimethylhydantoin, 1,3-diglycidyl-5,5-dimethylhydantoin, and 1,3-di-(2-hydroxy-3-metha-cryloyloxypropyl)-5,5-dimethylhydantoin, has an epoxide content of 2.78 equivalents/kg.

Resin V

This designation denotes a commercially-available sample of glycidyl acrylate, having an epoxide content of 7.8 equivalents/kg.

Resin VI

A 2,2-Bis(4-hydroxyphenyl)propane based epoxy resin having an epoxide content of 1.6 equivalents/kg (100 g) and 2,6-di-tert.butyl-4-methylphenol (0.1 g) are heated until molten, stirred together and heated to 130° C. To this mixture there is slowly added, over 30 minutes, a mixture of acrylic acid (10.7 g), chromium (III) tris octanoate (0.05 g) and 2,6-di-tert.butyl-4-methylphenol (0.2 g). On complete addition the mixture is stirred at 130° C. for a further 2 hours and cooled. The product has an epoxide content of 0.07 equivalents/kg (negligible).

Resin VII

A mixture containing trimellitic anhydride (192 g), 2-hydroxyethyl methacrylate (130 g), tetramethylammonium chloride (1 g) and hydroquinone (0.3 g) is heated in a reaction vessel for 2 hours at 60° C. by which time no anhydride remains.

To the mixture is added epichlorohydrin (185 g) and then it is reheated to 90° C. for a further 2 hours, by which time the epoxide content has fallen to zero.

A further amount of epichlorohydrin (925 g) is added, and the reaction is set to reflux at 55°–57° C., under a Dean and Stark trap under reduced pressure. To this is added a solution of sodium hydroxide (88 g) in water (88 g) over a period of 2 hours and the reflux is maintained for a further 1½ hours. A total of 124 g of water is collected during this reflux.

The mixture is then cooled, filtered, washed with 200 ml of 10% sodium dihydrogen orthophosphate, and finally twice with 500 ml of water. After drying with magnesium sulphate, which is removed by filtering, the excess epichlorohydrin is removed under reduced pressure whilst heating to 100° C. in a rotary evaporator to give a mixture of 1-(2-methacryloyloxyethoxycarbonyl)-2,4- and 2,5-bis(glycidyloxycarbonyl)benzene having an epoxide content of 3.36 eq/kg (73% of theory).

Resin VIII 3,4-Epoxycyclohexylmethyl-3',4'-epoxycyclohexane carboxylate, having an epoxide content of 7.2 equivalents/kg (100 g) and 2,6-di-tert.butyl-4-methylphenol (0.1 g) are stirred together and heated to 80° C. To this mixture there is slowly added, over 30 minutes, a mixture of acrylic acid (25.9 g), chromium (III) tris octanoate (0.07 g) and 2,6-di-tert.butyl-4-methylphenol (0.2 g). On complete addition the mixture is stirred at 80° C. for a further 2 hours and cooled. The product, consisting of a mixture of compounds of general formula

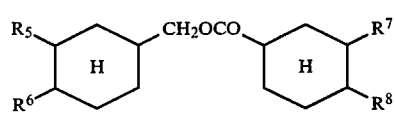

VI where $R^5$ and $R^6$, together with the carbon atoms to which they are attached, form an epoxy group or one denotes a hydroxyl group and the other denotes an acryloyloxy group and $R^7$ and $R^8$, together with the carbon atoms to which they are attached, form an epoxy group or one denotes a hydroxyl group and the other denotes an acryloyloxy group, has an epoxide content of 2.4 equivalents/kg.

Resin IX

Phenyl glycidyl ether having an epoxide content of 6.37 equivalents/kg (150.0 g), triphenyl phosphine (0.45 g) and 2,6-di-tert.butyl-4-methylphenol (0.3 g) are stirred together and heated to 100° C. To this mixture methacrylic acid (82.2 g) is added slowly over one hour. On complete addition the mixture is stirred at 100° C. for a further 5 hours and cooled. The product, consisting of a mixture of phenyl glycidyl ether and 2-hydroxy-3-methacryloyloxypropoxybenzene, has an epoxide content of 0.83 equivalent/kg.

Resin X

This designation denotes a commercially available sample of a hydrogenated 2,2-bis(4-hydroxyphenyl)propane based epoxy resin, having an epoxide content of 5.2 equivalents/kg.

Resin XI

An epoxidised novolak made from a phenol-formaldehyde novolak (starting P:F ratio of 4.33:1) and having an epoxide content of 6.23 equivalents/kg (100 g) and 2,6-di-tert.butyl-4-methylphenol (0.1 g) are heated until molten, stirred together and heated to 120° C. To this mixture there is slowly added, over one hour, a mixture of acrylic acid (42.6 g), chromium (III) trisoctanoate (0.05 g) and 2,6-di-tert. butyl-4-methylphenol (0.2 g). On complete addition the mixture is stirred at 120° C. for a further 3 hours when the epoxide content is 0.26 equivalents/kg. Further epoxidised novolak (6.77 g) and chromium (III) trisoctanoate (0.025 g) are added. The mixture is then stirred at 120° C. for a further 5 hours and cooled. The product has an epoxide content of 0.10 equivalent/kg (negligible).

Diphenyliodosyl Hexafluorophosphate

To a solution of sodium hydroxide (8 g) in 200 ml of water at 0° C. is added iodoxybenzene (23.6 g). Stirring is maintained at this temperature for 1½ hours. The mixture is filtered and the precipitate removed. A 10% solution of hexafluorophosphoric acid is added to the filtrate until the hydrogen ion concentration reaches $10^{-4}$ ML$^{-1}$. During this time a white precipitate forms; this is collected by filtration, washed with water and dried in air. The white solid is triturated with diethyl ether to remove any traces of iodobenzene, collected and redried to give a yield of 60% of diphenyliodosyl hexafluorophosphate, m.pt. 128°–130° C.

EXAMPLE 1

A mixture of 2,2-bis(4-(2-hydroxy-3-methacryloyloxypropoxy)phenyl)propane (40 parts), tripropyleneglycol diacrylate (10 parts), Resin II (50 parts), benzildimethylketal (2 parts) and boron trifluoride/monoethylamine complex (3 parts) is applied as a coating 20 μm thick onto a copper-clad laminate. It is heated for 40 minutes in an oven at 120° C. and allowed to cool, the resultant layer being non-tacky. The solidified layer is irradiated through a negative with a 5000 w metal halide lamp at a distance of 75 cm for 3 minutes. On development with a 10:1 mixture of toluene and acetone a good image is obtained.

EXAMPLE 2

Resin I (50 parts) and Resin IV (50 parts) are mixed with benzildimethylketal (2 parts) and boron trifluoride/monoethylamine complex (2 parts) and coated onto a copper-clad laminate as a layer 30 μm thick. The laminate is heated in an oven at 160° C. for 5 minutes and allowed to cool, the resultant coating being non-tacky. It is irradiated through a negative using a 5000 w metal halide lamp at a distance of 75 cm for 10 seconds. Development in hot water (80° C.) with gentle brushing, gives a good image.

EXAMPLE 3

Example 2 is repeated, replacing the quantities of resin used in that Example by Resin I (45 parts), Resin III (10 parts) and Resin IV (45 parts). The liquid coating is heated at 160° C. for 10 minutes, then irradiated for 10 seconds as described in Example 2. The image is developed by brushing in hot water.

EXAMPLE 4

A mixture of 2,2-bis(4-(2-hydroxy-3-methacryloyloxypropoxy)phenyl)propane (50 parts), phenylglycidyl ether (50 parts), benzildimethylketal (2 parts) and boron trifluoride monoethylamine complex (3 parts) is applied as a coating onto a copper-clad laminate. It is heated for 40 minutes in an oven at 120° C. and allowed to cool, the resultant layer being non-tacky. The solidified layer is irradiated through a negative with a 5000 w metal halide lamp at a distance of 75 cm for 10 minutes. On development with a 10:2 mixture of toluene and acetone an image is obtained.

EXAMPLE 5

A mixture of 2,2-bis(4-(2-hydroxy-3-methacryloyloxypropoxy)phenyl)propane (50 parts), Resin V (50 parts), benzildimethylketal (2 parts) and boron trichloride octyldimethylamine complex (3 parts) is applied as a coating onto a copper-clad laminate. It is heated for 40 minutes in an oven at 120° C. and allowed to cool, the resultant layer being non-tacky. The solidified layer is irradiated through a negative with a 5000 w metal halide lamp at a distance of 75 cm for 5 minutes. On development with acetone an image is obtained.

EXAMPLE 6

A mixture of Resin VI (50 parts), 1,4-diglycidyloxybutane (50 parts), benzildimethylketal (2 parts) and boron trifluoride monoethylamine complex (5 parts) is applied as a coating 20 μm thick onto a copper-clad laminate. It is heated for 20 minutes in an oven at 120° C. and allowed to cool, the resultant layer being non-tacky. The solidified layer is irradiated through a negative with a 5000 w metal halide lamp at a distance of 75 cm for 15 seconds. On development with a 1:1 mixture of toluene and acetone an image is obtained.

EXAMPLE 7

A mixture of Resin VI (50 parts), Resin II (30 parts), 1,4-diglycidyloxybutane (20 parts), benzilidimethylketal (2 parts) and boron trifluoride monoethylamine complex (2 parts) is applied as a coating 25 μm thick onto a copper-clad laminate. It is heated for 20 minutes in an oven at 120° C. and allowed to cool, the resultant layer being non-tacky. The solidified layer is irradiated 24 hours later through a negative with a 5000 w metal halide lamp at a distance of 75 cm for 5 minutes. On development with acetone a good image is obtained.

EXAMPLE 8

Resin VII (100 parts), benzildimethylketal (2 parts) and boron trifluoride monoethylamine complex is applied as a coating 20 μm thick onto a copper-clad laminate. It is heated for 10 minutes in an oven at 120° C. and allowed to cool, the resultant layer being non-tacky. The solidified layer is irradiated through a negative with a 5000 w metal halide lamp at a distance of 75 cm for 3 minutes. On development with acetone an image is obtained.

EXAMPLE 9

A mixture of Resin VIII (50 parts), 3,4-epoxycyclohexylmethyl-3',4'-epoxycyclohexane carboxylate (50 parts), benzildimethylketal (2 parts) and boron trifluoride monoethylamine complex (3 parts) is applied as a coating 20 μm thick onto a copper-clad laminate. It is heated for 5 minutes in an oven at 120° C. and allowed to cool, the resultant layer being non-tacky. The solidified layer is irradiated through a negative with a 5000 w metal halide lamp at a distance of 75 cm for 3 minutes. On development with cyclohexanone an image is obtained.

EXAMPLE 10

A mixture of resin VI (50 parts), 1,4-butanediol diglycidyl ether (50 parts), benzildimethylketal (2 parts), diphenyliodosyl hexafluorophosphate (3 parts) and copper acetylacetonate (1 part) is applied as a coating 20 μm thick onto a copper-clad laminate. It is heated for 30 minutes in an oven at 120° C. and allowed to cool, the resultant layer being non-tacky. The solidified layer is irradiated through a negative with a 5000 w metal halide lamp at a distance of 75 cm for 30 seconds. On development with a 1:1 mixture of toluene and acetone an image is obtained.

EXAMPLE 11

A mixture of 1-glycidyl-3-methacryloyloxyethyl-5,5-dimethylhydantoin (75 parts), Resin IX (25 parts), benzildimethylketal (2 parts) and boron trifluoride monoethylamine complex (3 parts) is applied as a coating 20 μm thick onto a copper-clad laminate. It is heated for 15 minutes in an oven at 120° C. and allowed to cool, the resultant layer being non-tacky. The solidified layer is irradiated through a negative with a 5000 w metal halide lamp at a distance of 75 cm for 30 seconds. On development with a 1:1 mixture of toluene and acetone an image is obtained.

EXAMPLE 12

A mixture of Resin VI (50 parts), iso-octylglycidyl ether (50 parts), benzildimethylketal (2 parts) and difluoroboronacetoacetanilide (5 parts) is applied as a coating 20 μm thick onto a copper-clad laminate. It is heated for 5 minutes in an oven at 120° C. and allowed to cool, the resultant layer being non-tacky. The solidified layer is irradiated through a negative with a 5000 w metal halide lamp at a distance of 75 cm for 30 seconds. On development with a 4:1 mixture of ethanol and toluene an image is obtained.

EXAMPLE 13

A mixture of Resin I (100 parts), diphenyliodosyl hexafluorophosphate (5 parts), copper acetylacetonate (2.5 parts), ascorbic acid (2.5 parts) and benzildimethylketal (2 parts) is applied as a coating 20 μm thick onto a copper-clad laminate. It is heated for 25 minutes in an oven at 120° C. and allowed to cool, the resultant layer being non-tacky. The solidified layer is irradiated through a negative with a 5000 w metal halide lamp at a distance of 75 cm for 30 seconds. On development with a 5:1 mixture of toluene and acetone an image is obtained.

EXAMPLE 14

A mixture of Resin VI (50 parts), Resin IX (25 parts), Fresin X (25 parts), benzildimethylketal (2 parts) and difluoroboron-acetoacetanilide (5 parts) is applied as a coating 20 μm thick onto a copper-clad laminate. It is heated for 10 minutes in an oven at 120° C. and allowed to cool, the resultant layer being non-tacky. The solidified layer is irradiated through a negative with a 5000 w metal halide lamp at a distance of 75 cm for 30 seconds. On development with acetone an image is obtained.

EXAMPLE 15

A mixture of Resin VI (50 parts), 3,4-epoxycyclohexylmethyl-3',4'-epoxycyclohexanecarboxylate (15 parts), polyethylene glycol monomethacrylate (35 parts), benzildimethylketal (2 parts) and difluoroboron-acetoacetanilide (5 parts) is applied as a coating 20 μm thick onto a copper-clad laminate. It is heated for 5 minutes in an oven at 120° C. and allowed to cool, the resultant layer being non-tacky. The solidified layer is irradiated through a negative with a 5000 w metal halide lamp at a distance of 75 cm for 20 seconds. On development with a 1:1 mixture of toluene and acetone an image is obtained.

EXAMPLE 16

A mixture of resin XI (50 parts), 3,4-epoxycyclohexylmethyl-3',4'-epoxycyclohexanecarboxylate (40 parts), polyethyleneglycol monomethacrylate (10 parts), benzildimethylketal (2 parts), difluoroboron-acetoacetanilide (5 parts) and finely divided silica (1 part) is applied as a coating 20 μm thick onto a copper-clad laminaate. It is heated for 10 minutes in an oven at 120° and allowed to cool, the resultant layer being non-tacky. The solidified layer is irradiated through a negative with a 5000 w metal halide lamp at a distance of 75 cms for 20 seconds. On development with acetone an image is obtained.

EXAMPLE 17

A mixture of 1-glycidyl-3-methacryloyloxyethyl-5,5-dimethylhydantoin (70 parts), polyethylene glycol monomethacrylate (30 parts), benzildimethylketal (2 parts), boron trifluoride monoethylamine complex (5 parts) and finely divided silica (3 parts) is applied as a coating 20 μm thick onto a copper-clad laminate. It is heated for 20 minutes in an oven at 120° C. and allowed to cool, the resultant layer being non-tacky. The solidified layer is irradiated through a negative with a 5000 w metal halide lamp at a distance of 75 cm for 5 minutes. On development with acetone an image is obtained.

EXAMPLE 18

A mixture of 1-glycidyl-3-methacryloyloxyethyl-5,5-dimethylhydantoin (70 parts), phenyl glycidyl ether (30 parts), benzildimethylketal (2 parts), boron trifluoride monoethylamine complex (5 parts) and finely divided silica (3 parts) is applied as a coating 20 μm thick onto a copper-clad laminate. It is heated for 15 minutes in an oven at 120° C. and allowed to cool, the resultant layer being non-tacky. The solidified layer is irradiated through a negative with a 5000 w metal halide lamp at a distance of 75 cm for 5 minutes. On development with a 1:1 mixture of toluene and acetone an image is obtained.

What is claimed is:

1. A process for the production of an image comprising
   (i) heating at a temperature of at least 80° C. a layer, supported on a carrier, of a liquid composition consisting essentially of
   (A) 1 to 10 parts per 100 parts of light sensitive compound or mixture of a heat-activated latent polymerizing agent for 1,2-epoxides with
   (B) a light-sensitive compound having in the same molecule at least one 1,2-epoxide group of formula

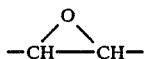   I and at least one unsaturated ester group of formula $CH_2=C(R^1)COO-$   II where $R^1$ is a hydrogen, chlorine, or bromine atom or an alkyl group of 1 to 4 carbon atoms, or with a mixture of
   (C) a compound containing at least one 1,2-epoxide group of formula I absent the unsaturated ester group of formula II, together with
   (D) a compound containing at least one unsaturated ester group of formula II absent the 1,2-epoxide group of formula I, or with a mixture of compound (B) and a compound (C) and/or a compound (D), such that the layer solidifies through thermal polymerization and becomes essentially non-tacky but remains photopolymerizable and subsequently
   (ii) exposing the solidified layer to actinic radiation in a predetermined pattern such that exposed parts of the layer are photopolymerized and
   (iii) removing those parts of the layer which have not become substantially photopolymerized by treatment with a solvent therefor.

2. A process according to claim 1, in which the group of formula I is attached to a cycloaliphatic ring through both indicated free valencies, or forms part of a 2,3-epoxypropyl group which is directly attached to an atom of oxygen, nitrogen, or sulphur.

3. A process according to claim 1, in which $R^1$, in the unsaturated ester group of formula II, is a hydrogen atom or a methyl group.

4. A process according to claim 1, in which compound (B) is present and contains 1 or 2 groups of formula I and 1 to 6 groups of formula II and has a molecular weight of at most 3000.

5. A process according to claim 4, in which compound (B) is of the formula

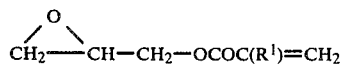   III

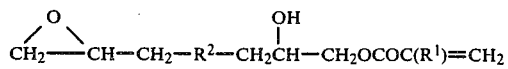   IV or

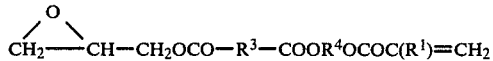   V where
$R^1$ is H, Cl, Br, or an alkyl group of 1 to 4 carbon atoms,
$R^2$ represents the residue of a di or polyglycidyl compound after the removal of two glycidyl groups,
$R^3$ represents the residue of a di or polycarboxylic acid after the removal of two carboxylic acid groups, and
$R^4$ represents an alkylene chain of from 1 to 6 carbon atoms.

6. A process according to claim 5, in which $R^2$ is a dihydric phenol residue after removal of two phenolic hydrogen atoms, a glycol residue after removal of two alcoholic hydrogen atoms, or a hydantoin residue after removal of two amidic hydrogen atoms.

7. A process according to claim 5, in which $R^3$ is a saturated or unsaturated aliphatic or aromatic dicarboxylic acid residue or an aromatic tri- or tetracarboxylic acid residue, after removal of two carboxylic acid groups, and $R^4$ is an ethylene, propylene, or butylene group.

8. A process according to claim 5, in which compound (B) is glycidyl acrylate, glycidyl methacrylate, 2-(4-glycidyloxyphenyl)-2-(4-(3-acryloyloxy-2-hydroxypropoxy)phenyl)propane, 2-(4-(glycidyloxyphenyl)-2-(4-(2-hydroxy-3-methacryloyloxypropoxy)phenyl)propane, 1-(2-methacryloyloxyethoxycarbonyl)-2,4- and 2,5-bis(glycidyloxycarbonyl)benzene, 1-(2-acryloyloxyethoxycarbonyl)-2,4- and 2,5-bis(glycidyloxycarbonyl)benzene, 2-acryloyloxyethoxy glycidyl succinate, 2-methacryloyloxyethoxy glycidyl succinate, 1-glycidyl-3-(3-acryloyloxy-2-hydroxypropyl)-5,5-dimethylhydantoin, 1-glycidyl-3-(2-hydroxy-3-methacryloyloxypropyl)-5,5-dimethylhydantoin, 1-glycidyloxy-4-(3-acryloyloxy-2-hydroxypropoxy)butane, 1-glycidyloxy-4-(2-hydroxy-3-methacryloyloxypropoxy)butane or the reaction product of 3,4-epoxycyclohexylmethyl-3',4'-epoxycyclohexane carboxylate with 1 equivalent of acrylic acid or methacrylic acid.

9. A process according to claim 1, in which compound (C) is present and contains one or two groups of formula I and has a molecular weight of at most 3000.

10. A process according to claim 1, in which compound (C) is present and is a mono or polyglycidyl ester, a mono or polyglycidyl ether, a poly(N-glycidyl) compound, or an epoxide resin in which some or all of the epoxide groups are not terminal.

11. A process according to claim 10, in which compound (C) is 2,2,4-trimethylpentyl glycidyl ether, phenyl glycidyl ether, butyl glycidyl ether, a diglycidyl ether of 2,2-bis(hydroxyphenyl)propane, bis(4-hydroxyphenyl)methane or butane-1,4-diol, 1,3-diglycidyl-5,5-dimethylhydantoin, or 3,4-epoxycyclohexylmethyl-3',4'-epoxycyclohexanecarboxylate.

12. A process according to claim 1, in which compound (D) is present and contains at least two groups of formula II and has a molecular weight of at most 3000.

13. A process according to claim 1, in which compound (D) is present and is an acrylate or methacrylate of a monohydric alcohol, a full or partial ester of acrylic or methacrylic acid with an aliphatic glycol or higher functional polyol, an ester formed by reaction of a compound containing one or more glycidyl groups with acrylic or methacrylic acid, or an ester formed by reaction of a polyepoxide with an equivalent amount of an adduct of a hydroxyalkyl acrylate or methacrylate with a saturated or unsaturated dicarboxylic acid anhydride.

14. A process according to claim 13, in which compound (D) is 1,4-bis(2-hydroxy-3-acryloyloxypropoxy)-butane, a poly(2-hydroxy-3-acryloyloxypropyl)ether of a bisphenol or a phenol-formaldehyde novolak, 2,2-bis(4-(2-hydroxy-3-(2-acryloyloxyethoxy)succinyloxypropoxy)phenyl)propane, 1-(2-hydroxy-3-acryloyloxypropoxy)-butane, -octane, or -decane, bis(2-hydroxy-3-acryloyloxypropyl)adipate, 2-hydroxy-3-acryloyloxypropyl propionate, 3-phenoxy-2-hydroxypropyl acrylate, or a corresponding methacrylic compound.

15. A process according to claim 1, in which (A) is a complex of boron trichloride or of boron trifluoride, a boron difluoride chelate, dicyandiamide, an imidazole, or a mixture of an aromatic onium salt or aromatic iodosyl salt of a metal halogenide acid or a metalloid halogenide acid with a catalyst which is a salt or complex of a d-block transition metal, a stannous salt, an organic peroxide, or an activated α-hydroxy compound which forms free radicals on heating.

16. A process according to claim 15, in which the polymerizing agent (A) is a complex of boron trichloride with a tertiary amine or of boron trifluoride with a primary amine, piperidine or a triaryl phosphine, or is a diphenyl iodosyl salt, in which the phenyl groups may be substituted by an alkyl group of to 4 carbon atoms, a nitro group or a halogen atom, and the anion is $Sb(OH)F_5^-$, $AsF_6^-$, $SbCl_6^-$, $BiCl_6^-$, $SbF_6^-$, $SnCl_5^-$, $FeCl_4^-$, $BF_4^-$ or $PF_6^-$.

17. A process according to claim 1, in which the layer of liquid composition is heated at a temperature of 100° C. to 200° C.

18. A process according to claim 1, in which the solidified layer is exposed to actinic radiation of wavelength 200–600 nm.

* * * * *